United States Patent [19]
Katayama et al.

[11] Patent Number: 6,048,754
[45] Date of Patent: *Apr. 11, 2000

[54] METHOD OF MANUFACTURING A SEMICONDUCTOR DEVICE WITH AN AIRTIGHT SPACE FORMED INTERNALLY WITHIN A HOLLOW PACKAGE

[75] Inventors: Shigeru Katayama; Kaoru Tominaga; Junichi Yoshitake, all of Sodegaura, Japan

[73] Assignee: Mitsui Chemicals, Inc., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/260,977

[22] Filed: Jun. 15, 1994

Related U.S. Application Data

[62] Division of application No. 08/155,539, Nov. 22, 1993, Pat. No. 5,343,076, which is a continuation of application No. 07/731,979, Jul. 18, 1991, abandoned.

[30] Foreign Application Priority Data

Jul. 21, 1990 [JP] Japan ..................................... 2-193617
Feb. 21, 1991 [JP] Japan ..................................... 3-27106
Jun. 13, 1991 [JP] Japan ..................................... 3-142056

[51] Int. Cl.⁷ ........................... H01L 21/52; H01L 21/56; H01L 21/58; H01L 21/60
[52] U.S. Cl. ...................... 438/115; 438/118; 438/122; 438/123; 438/124
[58] Field of Search ................... 437/207, 211, 437/214, 217, 219, 220, 902; 257/676, 717, 796, 787; 264/272.17; 174/52.4; 438/115, 118, 122, 123, 124

[56] References Cited

U.S. PATENT DOCUMENTS

| | | | |
|---|---|---|---|
| 3,762,039 | 10/1973 | Douglas et al. | 437/217 |
| 3,930,114 | 12/1975 | Hodge | 264/272.17 |
| 3,981,074 | 9/1976 | Yamamoto et al. | 264/272.17 |
| 4,717,948 | 1/1988 | Sakai et al. | |
| 4,875,087 | 10/1989 | Miyauchi et al. | 357/71 |
| 4,953,002 | 8/1990 | Nelson et al. | 357/74 |
| 4,961,106 | 10/1990 | Butt et al. | 357/74 |
| 4,965,659 | 10/1990 | Sasame et al. | 357/81 |
| 4,975,761 | 12/1990 | Chu | 357/72 |
| 4,994,895 | 2/1991 | Matsuzaki et al. | 357/72 |
| 5,034,800 | 7/1991 | Maschisi | 357/72 |
| 5,049,977 | 9/1991 | Sako | 357/72 |
| 5,063,434 | 11/1991 | Emoto | 357/72 |
| 5,089,879 | 2/1992 | Komenaka | 357/72 |

FOREIGN PATENT DOCUMENTS

| | | | |
|---|---|---|---|
| 51-138165 | 11/1976 | Japan . | |
| 52-9502 | 3/1977 | Japan . | |
| 58-069174 | of 1983 | Japan . | |
| 58-106840 | 6/1983 | Japan | 437/217 |
| 58-148440 | 9/1983 | Japan . | |
| 59-155160 | 9/1984 | Japan . | |
| 59-172253 | 9/1984 | Japan . | |
| 61-252652 | 11/1986 | Japan | 257/787 |
| 62-193162 | 8/1987 | Japan | 437/220 |
| 63-054756 | of 1988 | Japan . | |
| 63-116462 | of 1988 | Japan . | |
| 63-44745 | of 1988 | Japan . | |
| 63-152159 | 6/1988 | Japan . | |
| 63-250846 | 10/1988 | Japan | 437/219 |
| 63-308355 | 12/1988 | Japan | 257/787 |
| 1011356 | 1/1989 | Japan . | |
| 64-11356 | 1/1989 | Japan . | |
| 2058358 | of 1990 | Japan . | |
| 2105542 | 4/1990 | Japan . | |
| 2105545 | 4/1990 | Japan . | |
| 2-163953 | 6/1990 | Japan . | |
| 2-297954 | 12/1990 | Japan . | |
| 4-180252 | 6/1992 | Japan . | |

*Primary Examiner*—David Graybill
*Attorney, Agent, or Firm*—Birch, Stewart, Kolasch & Birch, LLP

[57] ABSTRACT

A process for manufacturing a package of a semiconductor device, and providing a semiconductor device in which a vapor-impermeable moistureproof plate is embedded in a bottom surface of a hollow package or an inner surface wallthicknesswise therefrom to provide moisture-proofness.

22 Claims, 3 Drawing Sheets

LENGTH FROM BONDING SURFACE TO
UPPER SURFACE OF ISLAND PORTION (t) [mm]

METHOD OF MANUFACTURING A SEMICONDUCTOR DEVICE WITH AN AIRTIGHT SPACE FORMED INTERNALLY WITHIN A HOLLOW PACKAGE

This application is a divisional of application Ser. No. 08/155,539, filed on Nov. 22, 1993, U.S. Pat. No. 5,343,076 the entire contents of which are hereby incorporated by reference, which is a continuation of Ser. No. 07/731,979, filed on Jul. 18, 1991, now abandoned.

BACKGROUND OF THE INVENTION

The present invention relates to a semiconductor device and method for manufacturing the same, and more specifically, to a semiconductor device in which moisture-proofness of an airtightly sealed semiconductor package is improved and a method for manufacturing the same.

In a semiconductor chip such as an IC, LSI or VLSI, a highly-integrated circuit surface tends to be affected by the change in ambient temperature, humidity, or fine dust. Further, since the semiconductor chip itself may be broken by mechanical vibration or other type of shock, a semiconductor device includes a package for covering the semiconductor chip.

The package may be either an airtight seal type package or a resin mold type package. In the airtight seal type, an air-tight space is formed in the central portion of a package member, and the semiconductor chip is arranged within the airtight space. Ceramics having a high moisture-proofness are generally used as the hollow package material, but synthetic resins which have low cost and are easy to work with are also used.

In a semiconductor device using a hollow package made of synthetic resin, a semiconductor chip is secured to a bonding surface (a chip bonding surface) of a hollow portion with adhesive and is electrically connected to a lead frame with a bonding wire. Opposite ends of the lead frame are opened to an inner side and an outer side of the package.

The top surface of the hollow package is airtightly sealed by securing a cover member or lid such as a transparent or opaque synthetic resin plate, a glass plate or the like thereto with adhesives.

When a hollow package made of synthetic resin is used, there arises a problem in that even if the cover member is secured with adhesive, a fine amount of moisture enters the package as time passes. As a result, electrodes of the semiconductor chip or internal circuit corrode and degrade the performance of the semiconductor chip, and finally result in the semiconductor chip being unusable.

Even if a careful seal is applied to an adhesive portion of the cover or a seal portion of the lead frame which are believed to be where the moisture enters, it is still not possible to prevent entry of moisture after passage of time.

The present inventors have studied the entry of moisture into airtightly sealed semiconductor packages. Originally, it was assumed that a route of entry of moisture into the semiconductor package was via the adhesive portion of the cover member or the seal portion of the lead frame, and tests were repeatedly performed to verify this assumption.

However, it has been determined that the entry of moisture from the adhesive portion of the cover member or the seal portion of the lead frame possess is not much of a problem since various countermeasures may be taken to avoid this. The entry of moisture into the semiconductor package principally results from the moisture which transmits through a molded body from the lowermost surface of the package, that is, the bottom surface of the hollow package.

It is to be noted that the entry of moisture into the semiconductor package was tested in the following manner. A package sealed by a transparent cover member was placed into a commercially available pressure cooker tester (PCT) and heated and pressurized at 121° C., a relative humidity of 100% and a gauge pressure of 1 kg/cm² for a predetermined number of hours, after which the package was removed to examine if condensation had formed caused by moisture which entered internally via a transparent cover member under normal temperature.

Those packages which had no condensation were further heated and pressurized for the predetermined number of hours until condensation appeared.

In the present invention, the quality of the moisture proofness of the package was determined by the heating and pressurizing time until condensation appeared in the inside of the transparent cover member.

It is an object of the present invention to provide a semiconductor device of an airtight seal type having excellent moisture-proofness which can effectively prevent the entry of moisture into the semiconductor device.

SUMMARY OF THE INVENTION

The present invention includes a vapor-impermeable moistureproof plate provided on the bottom surface of a hollow package or inside the bottom surface of the hollow package.

According to a first embodiment of the moistureproof plate, an island portion connected to a lead frame through a support lead is formed on the bottom surface of the hollow package or inside the bottom surface of the hollow package.

This support lead is important for accurately fixing the island portion, but even if the support lead is cut interiorly after molding, the effect of preventing the moistureproofness of the semiconductor device is not diminished.

Accordingly, during molding, the island portion as well as the lead frame itself are set beforehand within a mold to effect insert molding so that an integrally molded hollow package can be manufactured.

The island portion is preferably connected to the lead frame through the support lead so that a semiconductor package with the island portion fixed at an accurate position at the time of molding can be manufactured.

Furthermore, the present invention provides a semiconductor device in which said island portion is provided internally (lower) of the bonding surface and internally (upper) of the bottom surface of the hollow package; in particular the island portion is at least 100 μm or more from the bonding surface, as illustrated in FIG. 5 whereby the prevention or impediment of entry of moisture into the hollow package is further effectively achieved.

Moreover, in the present invention, after a lead frame having an island portion has been set to a predetermined position within a mold, a synthetic resin is subjected to injection molding or transfer molding, so that the island portion, the lead portion, and the hollow package can be integrated.

According to a second embodiment of the present invention, a moistureproof plate formed from a vapor-impermeable plate-like member is embedded on the bottom surface of an airtight sealed hollow package or on an inner portion wall-thicknesswise therefrom.

In this embodiment, since the moistureproof plate is an element separate from the lead frame, there is the advantage that the material, size, etc. of the moistureproof plate can be suitably selected irrespective of a material or size of the lead frame.

BRIEF DESCRIPTION OF THE DRAWINGS

FIG. 1 is a side sectional view showing one example of a hollow package according to the present invention integrated by insert molding;

FIG. 2 is a side sectional view showing one example in which an airtight sealed semiconductor device is completed;

FIG. 3 is a side sectional view showing a further example in which an airtight sealed semiconductor device is completed;

FIG. 6 is a side sectional view showing one example of a hollow package of the present invention integrated by insert molding, and FIG. 7 is a side sectional view showing one example in which an airtight sealed semiconductor device is completed.

DETAILED DESCRIPTION OF THE INVENTION

A semiconductor device according to this invention comprises a semiconductor chip with a hollow package, a lid (cover member) and a moisture proof plate, to provide excellent moisture-proofness of an airtightly sealed semiconductor package construction.

Figure 1:
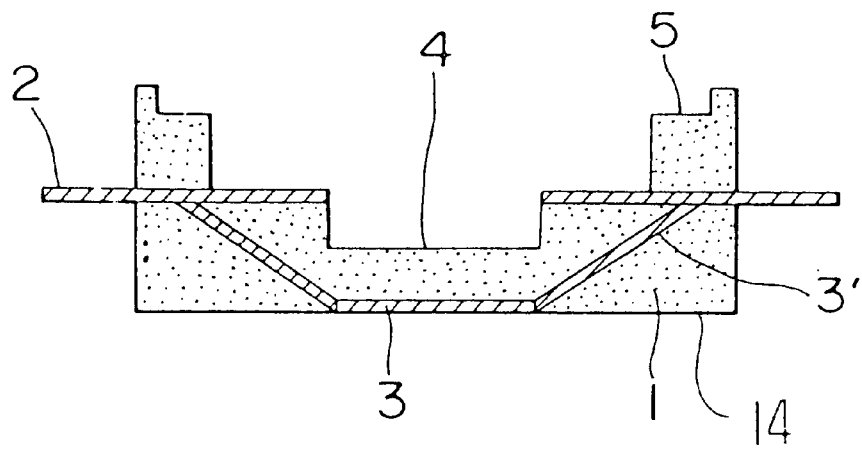
FIGS. 1 to 3 show a first embodiment of the present invention.

In more detail, a hollow package 1 in FIG. 1 is made of synthetic resin, and is preferably molded of thermosetting resins such as epoxy resin, polyimide resin (for example polyaminomaleimide, polypyfomeritimide), phenol resin, unsaturated polyester resin, silicon resin. etc., or heat resistant thermoplastic resins such as liquid-crystal polymer, polyphenylsulfide resin, polysulfone resin, etc.

Among the synthetic resins aforementioned, epoxy resin such as bisphenol-A type, orthocresol novolak type, glycidyl amine type, etc., is preferred in view of its mouldability and moisture-proofness, and a hollow package may be provided by injection or transfer moulding.

Figure 6:
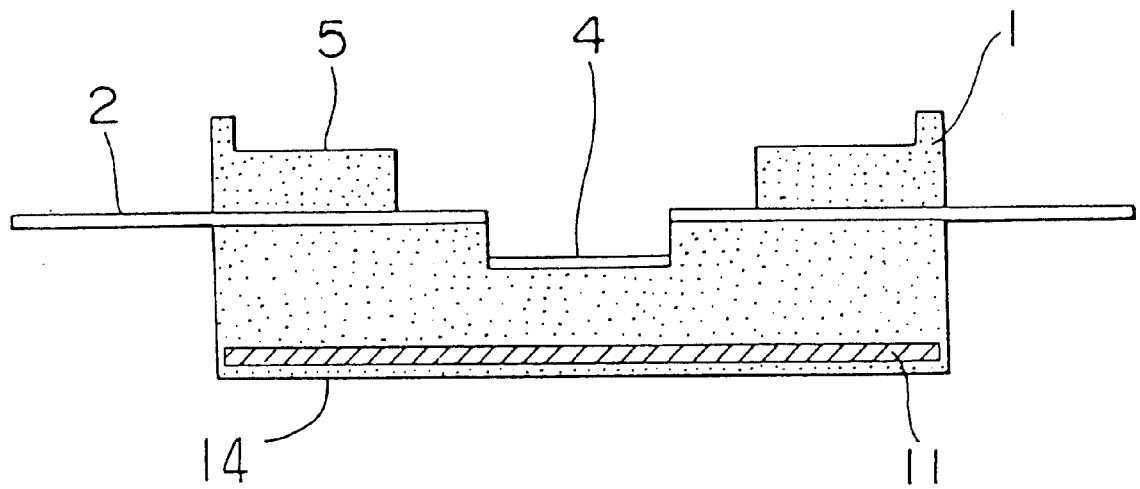
FIGS. 6 and 7 show a second embodiment of the present invention.

The moistureproof plate 11 in FIG. 6 can be a vapor impermeable plate-like member, particularly, where a material such as metal such as iron, copper, nickel, aluminum, alloys and their oxide, ceramic, glass, etc. is utilized. When metals such as aluminum, copper and iron, alloys or their oxides which have a heat transfer rate in excess of 0.01 cal/cm. sec. ° C. are used, not only is the moisture-proofness improved but also a heat generation phenomenon of the semiconductor chip 7 is radiated outside the package is obtained, and the operating stability of the semiconductor element can be also retained.

If the moisture proof plate 11 includes part of the lead frame 2, the lead frame 2 is desirably formed of a material selected out of copper, iron, aluminum or a group comprising an alloy thereof, or preferably 42 alloy or a copper alloy.

Figure 2:
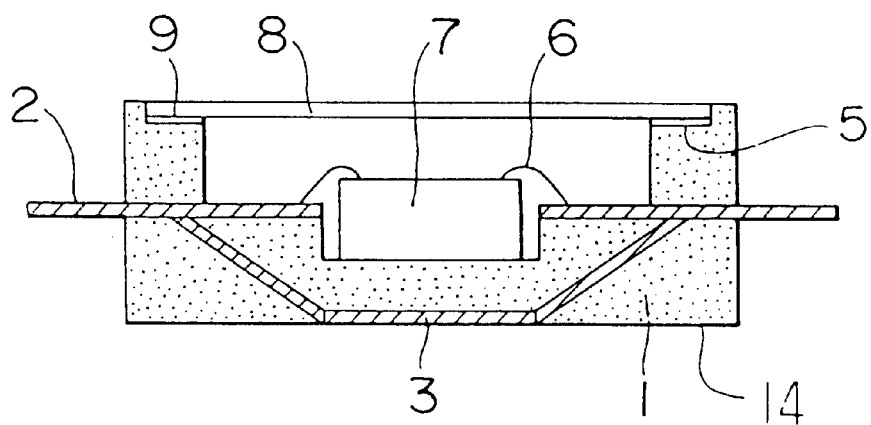

The lead frame 2 of FIG. 2 is wholly or partly applied with a surface treatment, for example, a plating such as gold, silver, nickel, solder, etc. For example, nickel plating containing no lustering agent can be used. More specifically, saccharin or the like can be added to smooth the plated surface.

(Embodiment 1)

In FIG. 1 showing in a side sectional view of one example of a package for semiconductor device in which an island portion 3 is formed internally of a bottom surface of the hollow package 1 reference numeral 1 designates a hollow package made of synthetic resin; and 2, a lead frame.

The island portion 3 is connected to the lead frame 2 through a support lead 3' and secured to a position lower than the other lead portion.

Reference numeral 4 designates a bonding surface on which a semiconductor chip 7 is secured by means of an adhesive, and numeral 5 designates a cover adhesive portion for sealing a space in the package.

The hollow package 1 is molded out of the aforesaid synthetic resins such as epoxy resin, polyimide resin.

The lead frame 2 (including the island portion 3) is formed of a material from the group of copper, iron aluminum, or an alloy thereof and preferably a copper alloy.

Another plate-like material such as a copper plate can be joined to the island portion 3 for improving heat radiation properties. In this manner, the plate-like member such as the copper plate is joined to the island portion 3 so that not only is the moisture-proofness of the semiconductor device improved but also the heat radiation properties of the semiconductor chip 7 outside the package are improved to thereby retain the stability of operation of the semiconductor chip 7.

The plate-like member may have the same size as that of the island portion 3, or a larger area.

Figure 4:
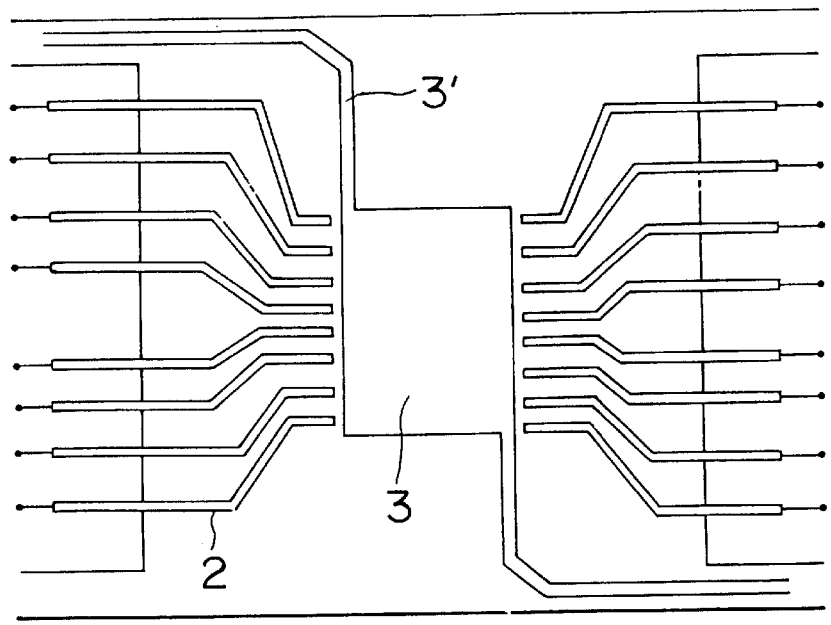
FIG. 4 is a top view showing one example of shapes of a lead frame and an island before insert molding in the first embodiment.

In the present embodiment, the island portion 3 is connected to the lead frame 2 through the support lead 3' as shown in FIG. 4.

The island portion 3 is integrally formed on the same plane as the lead frame 2 at the time of fabrication as a part of the lead frame 2, but the island portion 3 is depressed by a suitable amount by post-working.

Accordingly, the island portion 3 and the lead frame 2 are formed of the same material. However, in order to improve the anticorrosion and radiation properties of the hollow package 1, only the island portion 3 is partly plated using the copper plate as mentioned above.

Figure 3:
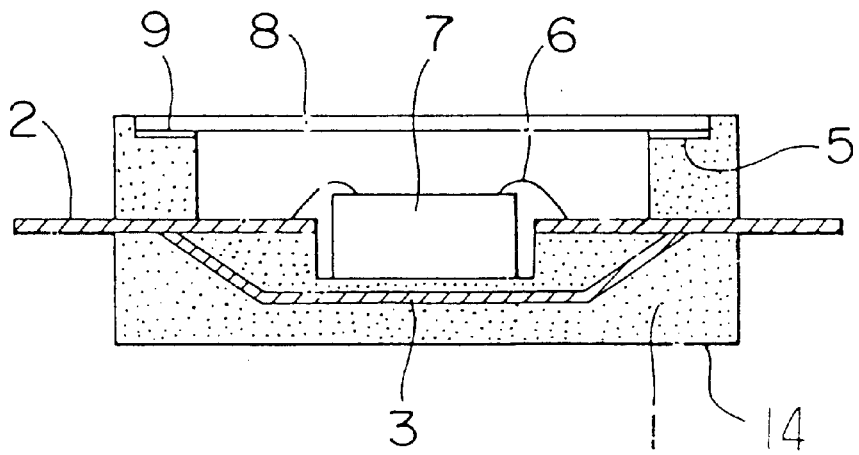
Figure 5:
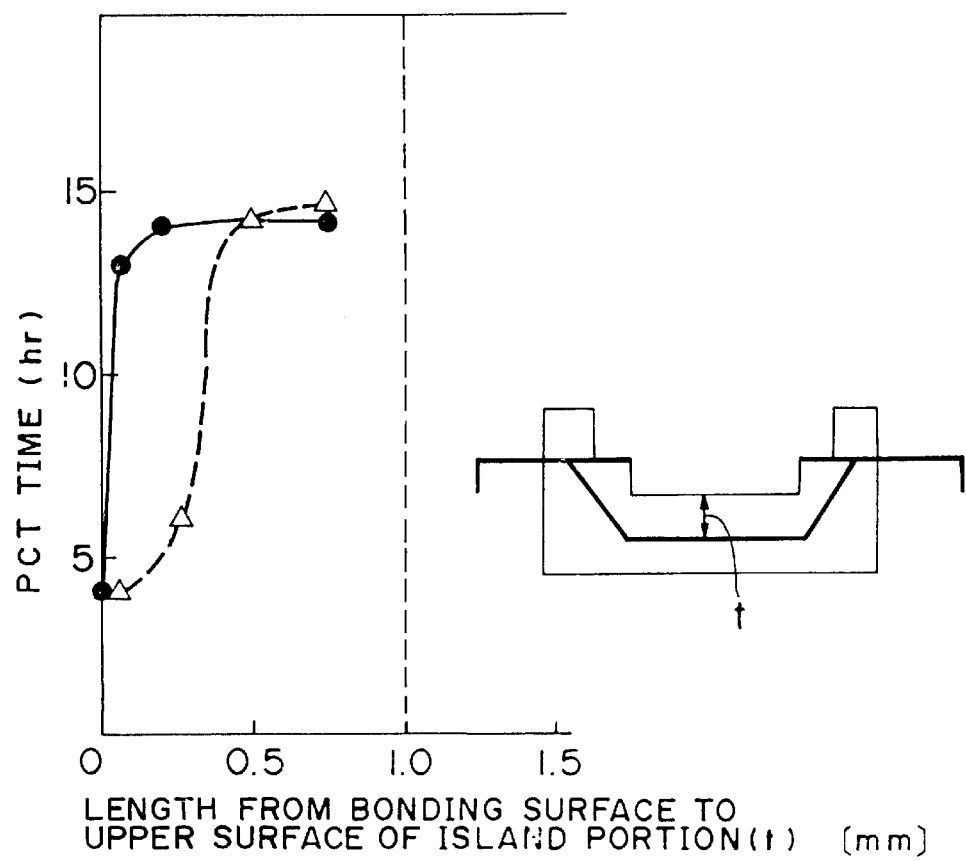
FIG. 5 is a graph showing the result of a pressure cooker test according to differences in position in which an island is formed in the first embodiment.

As described above, the island portion 3 is formed inwardly (in FIGS. 1–3 below the bonding surface 4) from the bonding surface 4 and inwardly (in FIGS. 1–3 above the bottom surface 14 of the package) from the bottom surface 14 of the hollow package 1. In particular, the island portion 3 is at least 100 μm or more from the bonding surface 4, as illustrated in FIG. 5.

The registration of the upper surface of the island portion 3 with the bonding surface is not preferable since this lowers the moisture-proofness of the hollow package.

The forming position of the island portion 3 is further suitably adjusted when the lead frame 2 is pressed.

The thickness of the island portion 3 is normally 50 to 1000 μm, preferably, 100 to 500 μm, and has a size which is substantially the same as that of a bottom surface of the semiconductor chip 7. A larger island portion 3 produces better results.

The lid adhesive portion 5 is provided with a shoulder as shown in order to obtain a better sealing effect.

The semiconductor chip 7 is secured to the bonding surface 4 of the hollow package 1. The semiconductor chip and the lead frame 2 are connected by a bonding wire 6, and the cover member 8 or lid is adhered to the cover adhesive portion 5 of the package 1 with an adhesive such as an epoxy group, imide group or acrylic group to provide an airtight seal.

The bonding wire 6 is usually gold or aluminum wire. The cover member 8 or lid may be a transparent cover member such as a glass plate, a sapphire plate, a transparent alumina plate, a transparent plastic plate, etc. or a translucent or opaque cover member such as a colored glass plate, a ceramic plate, a colored plastic plate, etc.

While FIGS. 1–2 show an example in which the lower surface of the island portion 3 is at a position at the bottom surface of the hollow package, it is to be noted that the island portion 3 may be arranged further inwardly of the bottom surface of the hollow package.

A semiconductor device according to this embodiment is manufactured as follows.

The lead frame 2 having the island portion 3 depressed by a predetermined distance from other portions is set to a predetermined position within the mold, and subsequently, epoxy resin such as bisphenol A type, orthocresol novolak type, glycidyl amine type, etc., are integrated by injection or transfer molding.

According to this method, a position of the island portion 3 of the lead frame 2 sealed into the hollow package 1 is depressed by suitable pressing means, for example, press machine so that it can be determined in advance to an accurate position. Therefore, a single step of inserting at the time of molding will suffice, and the trouble of cumbersome positioning can be omitted.

The conditions of insert molding differ when using different kinds of resins. In an example using epoxy resin, preferably, pressing and heating are carried out such that the resin is poured at a pressure of 10 to 800 kg/cm$^2$ at a mold temperature 150 to 200° C. and for a holding time of 1 to 5 minutes, and post-curing is added as needed. The lead frame 2 having the depressed island portion 3 is subjected to insert molding whereby the island portion 3 with excellent moisture-proofness is secured with high precision to the bottom surface of the hollow package 1 or to an inner portion therefrom. The operating steps can be simplified, and in addition, positive fixing can be attained.

The present inventors have conducted the following experiments in order to measure the moisture-proofness of the semiconductor package according to the present embodiment.

It is to be noted that the entry of moisture into the semiconductor package was tested by the following method (Method A for evaluation).

A package sealed by a transparent cover member 8 was put into a commercially available pressure cooker tester and heated and pressurized for two hours under the conditions of 121° C., relative humidity of 100% and a gauge pressure of 1 kg/cm$^2$, after which the package was removed. The package on the side of the transparent cover member was pressed against the hot plate and heated for 15 seconds at 80° C., and thereafter the transparent cover member was pressed against a brass block for 10 seconds at 25° C. to determine if condensation caused by entering moisture formed inside of the transparent cover member. Those packages with no condensation had less entering moisture, and produced no practical problem. Accordingly, in the present invention, the quality of the moisture-proofness of the package is determined by the length of heating in the pressure cooker tester time until condensation appears internally of the transparent cover material.

Experiment 1

A lead frame 2 (thickness: 250 μm) made of 42 alloy subjected to nickel plating with a lustering agent (saccharin) combined having an island portion 3 as shown in FIG. 4 was pressmolded. only the island portion 3 was depressed and set to a predetermined position within the mold of a transfer molding machine.

Next, molding material of an orthocresol novolak type epoxy resin and phenol novolak curing agent was transferred into the mold with a temperature of 180° C., a pressure of 120 kg/cm$^2$ for 3 minutes, after which the package was subjected to post-curing for three hours at 180° C. to obtain a molded article (thickness of bottom is 1 mm) as shown in FIG. 1.

Subsequently, the cover adhesive portion 5 was coated with the epoxy resin to form an adhesive layer 9, to which a cover member 8 made from a transparent glass plate was adhered to airtightly seal a hollow package 1.

This hollow package 1 was applied to a pressure cooker tester under the above-mentioned conditions.

The package was removed every two hours to examine if condensation appears on the inside of the glass cover member 8.

No condensation was recognized at 12 hours but condensation was recognized first after 14 hours. The result obtained by measuring the difference of moisture-proofness varying the forming position from the package die pad surface (bonding surface 4) to the upper surface of the island portion 3 was as indicated by the dotted line (marked by Δ) in FIG. 5. The thickness of the package used (from the bottom surface of the semiconductor chip 7 (bonding surface) to the bottom surface of the package) was 1 mm. Time until a blur occurs inside was measured by the same method.

On the other hand, in a package fabricated in exactly same manner except that an incorporation of the island portion is not utilized, resulted in condensation being recognized in four hours by a similar pressure cooker test.

Experiment 2

An experiment was conducted in a manner similar to that of the aforesaid Experiment 1 except that nickelplated 42 alloy with no lustering agent was used as the lead frame 2.

The result obtained by measuring the difference of moisture-proofness while varying a forming position (t) from the bonding surface 4 to the upper surface of the island portion was shown by the solid line (marked by ●) in FIG. 5.

It has been found from the experiment that the position in which the island portion 3 is formed is preferably provided at an inner portion from the bonding surface 4, and internally of the bottom surface of the hollow package 1, particularly, closer to the bottom surface by at least 100 μm or more from the bonding surface.

Experiment 3

An experiment was conducted in a manner similar to that of the aforesaid experiment 1 except that 42 alloy with no plating was used as the lead frame.

As the result, the same evaluation as the mark ● in FIG. 5 was obtained.

(Embodiment 2)

In this embodiment, a moisture proof plate 11 separate from a lead frame 2 is embedded from the bottom surface of a hollow package 1, as shown in FIG. 6.

In FIG. 6, the reference numeral 1 designates a hollow package formed of thermosetting resins such as epoxy resin. polyimide resin: 2, a lead frame formed of 42 alloy, copper alloy, etc.: 4, a bonding surface for securing a semiconductor chip; and 5, a cover adhesive portion for sealing a semiconductor device, the cover adhesive portion being provided with a shoulder for providing better sealing effect similarly to the aforementioned Embodiment 1.

The reference numeral 11 designates a moisture proof plate which comprises the technical feature of the present embodiment, and which is selected from the aforementioned materials.

When alloys or their oxide which have a heat transfer rate in excess of 0.01 cal/cm. sec. ° C. are used, not only is the moisture-proofness improved but also the heat radiation properties of the semiconductor chip 7 outside the package are improved to thereby retain the stability of operation of the semiconductor element.

The thickness of the moistureproof plate 11 is normally 50 to 1000 $\mu$m, preferably, 100 to 500 $\mu$m.

The size of the moistureproof plate 11 is selected between the size of the bottom surface of the semiconductor chip 7 and the size of the bottom surface of the hollow package and is preferably, as shown in FIG. 6, substantially the same as the bottom surface (lowermost surface) of the hollow package 1.

Further, the moistureproof plate 11 is embedded on the bottom surface 14 of the hollow package 1 or inwardly thereof as shown in FIG. 6. In the case where a radiation plate is added to the moistureproof plate 11, the moistureproof plate 11 may be provided closer to the semiconductor chip 7 (for example, by adjusting the length of a lead member 10).

Figure 7:
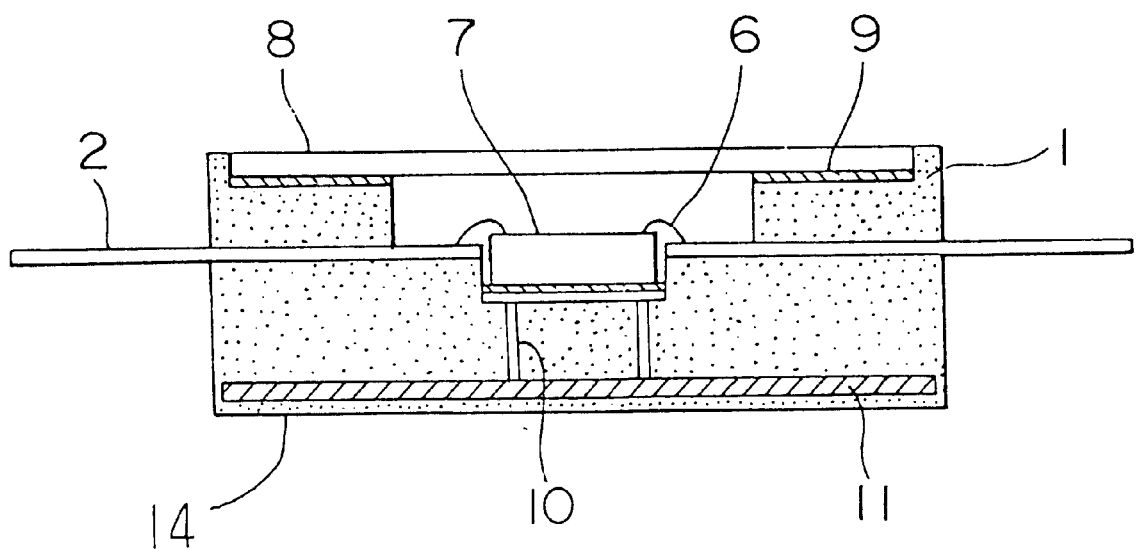

Furthermore, as shown in FIG. 7, a lead member 10 which is hung directly below the bonding surface 4 and connected to the moistureproof plate 11 may be provided. Naturally, in this case, the lead member 10 is preferably of a material having a heat transfer is rate in excess of 0.01 cal/cm sec. ° C. With the lead member 10, heat generated from the semiconductor chip 7 is transmitted to the moistureproof plate 11 to enhance the radiation effect.

A lead frame 2 made of 42 alloy an a moistureproof plate 11 made of copper alloy having a thickness of 250 $\mu$m and a heat transfer rate of 0.53 cal/cm. sec. ° C. were inserted at a predetermined position within a mold of a transfer molding machine. Next, a novolak type epoxy resin as molding material together with curing agent was insert-molded where the temperature was 180° C., the pressure was 80 kg/cm$^2$ for 2 seconds, after which the resin was subject to post-curing for 3 hours at a temperature of 180° C. to obtain a hollow package 1 as shown in FIG. 6.

Then, a cover member 8 made from a transparent glass plate was adhered to a cover adhesive portion 5 of the hollow package 1 by an epoxy resin (adhesive layer 9).

The aforementioned insert molding conditions differ with the kind of resin used. However, in case of the epoxy resin, pressing and heating is performed at a pressure of 10 to 500 kg/cm$^2$ and a temperature of 150 to 200° C., for 1 to 5 minutes.

The moistureproof plate 11 is subject to insert molding simultaneously with the lead frame 2 whereby the moistureproof plate 11 is fixed with high precision on the bottom surface of the hollow package 1 or inwardly therefrom. Not only is the manufacturing step simplified but also accurate fixing is attained as compared with the method for adhering the moistureproof plate 11.

The airtight sealed package was evaluated under the following conditions (Method B for evaluation). Specifically, this package was applied to a pressure cooker tester at a temperature of 121° C., a relative humidity of 100% and a gauge pressure of 1 kg/cm$^2$. The package was removed every 5 hours and was left at room temperatures for an hour to determine if condensation was recognizable inside the glass cover at room temperature.

Incidentally, the package was not forcibly cooled under this Method B for evaluation. However, under aforesaid Method A for evaluation, that package was forcibly cooled.

As a result, condensation was not recognized after 45 hours but recognized first after 50 hours. On the other hand, in a package fabricated without a moisture-proof plate, condensation was recognized in 20 hours by a similar pressure cooker test.

As described above. according the present embodiment, by formation of a layer of a vapor-impermeable moisture-proof plate 11 on the bottom surface of the hollow package 11 or inwardly therefrom, an entry of moisture from the bottom surface of the package in which a moisture permeability into the semiconductor package is highest is efficiently prevented. Furthermore, by insert molding of the moistureproof plate 11 along with the lead frame 2, the moisture proof plate 11 can be fixed to the inner surface or outer surface of the hollow package 1 with high precision and by a simple step.

A semiconductor chip 7 according to the invention is used in a solid image pickup element such as Charge Coupled Device, Metal Oxide Semiconductor or Charge Priming Device. It is sealed by aforesaid hollow package and a lid (cover member 8) which is made from a transparent glass.

When a solid image pickup device is produced with the members, the device has features of airtightness, vaportightness and high reliability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a hollow package comprising the steps of:

a) depressing an island portion formed in a substantially central portion of a lead frame, a distance from a surface of the lead frame:

b) locating the lead frame and the island portion connected thereto by a support lead in a position within a mold, so that a face of said island portion faces a hollow side of the hollow package, c) pouring synthetic resin into said mold, so that at least the face of the island portion is covered with the synthetic resin; and d) hardening the synthetic resin, to integrate the lead frame with the hollow package, thereby forming an area in the hollow package to affix a semiconductor chip.

2. A method of manufacturing a hollow package comprising the steps of:

a) depressing an island portion formed in a substantially central portion of a lead frame, a distance from a surface of the lead frame;

b) locating the lead frame and the island portion connected thereto by a support lead in a position within a mold;

c) pouring synthetic resin into said mold to embed the island portion entirely in the synthetic resin; and d) hardening the synthetic resin, to integrate the lead frame with the hollow package, thereby forming an area in the hollow package to affix a semiconductor chip;

wherein an area of the island portion is greater than or equal to an area of a bottom surface of the semiconductor chip of a semiconductor device, wherein the island portion is at a position lower than a surface of the lead frame connected to the island portion by a support lead and at a position lower than the bottom surface of the semiconductor chip, and wherein the island portion is provided lower than an area in the hollow package to affix the semiconductor chip by at least 100 μm.

3. A method of manufacturing a semiconductor device comprising the step of:
 a) depressing an island portion formed in a substantially central portion of a lead frame, a distance from a surface of the lead frame;
 b) locating the lead frame and the island portion connected thereto by a support lead in a position within a mold, so that a face of the island portion faces a hollow side of the hollow package;
 c) pouring synthetic resin into said mold so that at least the face of the island portion is covered with the synthetic resin;
 d) hardening the synthetic resin to integrate the lead frame with a hollow package; and
 e) placing a semiconductor chip on an inner surface of a bottom portion of the hollow package.

4. A method of manufacturing a semiconductor device comprising the step of:
 a) depressing an island portion formed in a substantially central portion of a lead frame, a distance from a surface of the lead frame;
 b) locating the lead frame and the island portion connected thereto by a support lead in a position within a mold;
 c) pouring synthetic resin into said mold to embed, the island portion as a moistureproof plate entirely in the synthetic resin;
 d) hardening the synthetic resin to integrate the lead frame with a hollow package; and
 e) placing a semiconductor chip on an inner surface of a bottom portion of the hollow package;
 wherein the semiconductor chip is bonded on a portion of the synthetic resin above the island portion, thereby placing the semiconductor chip in the hollow package.

5. The method of claim 3, wherein said step (b) the lead frame and the island portion are fixed in place by injection or transfer molding.

6. The method of claim 3, further comprising the step of:
 d) cutting the support lead to disconnect the island portion and the lead frame.

7. The method of claim 1 or claim 5, where the synthetic resin is an epoxy resin selected from a group consisting of a bisphenol A, orthocresol novolak, or glycidyl amine epoxy resin.

8. The method of claim 1 or claim 5, wherein said step (c) the synthetic resin is poured by injection or transfer molding.

9. The method of claim 1 or claim 5, wherein an area of the island portion is greater than or equal to the area in the hollow package to affix the semiconductor chip.

10. The method of claim 1 or claim 5, wherein the island portion is at a position lower than a surface of the lead frame connected to the island portion by a support lead and a position lower than the area in the hollow package to affix the semiconductor chip.

11. The method of claim 1 or claim 5, wherein the island portion is provided lower than the area in the hollow package to affix the semiconductor chip by at least 100 μm.

12. The method of claim 3 or claim 6, wherein an area of the island portion is greater than or equal to a bottom surface of the semiconductor chip.

13. The method of claim 3 or claim 6, wherein the island portion is at a position lower than a surface of the lead frame connected to the island portion by a support lead and at a position lower than a bottom surface of the semiconductor chip.

14. The method of claim 3 or claim 6, wherein the island portion is provided lower than an area to affix the semiconductor chip by at least 100 μm.

15. The method of claim 3 or claim 6, wherein said step (c) the synthetic resin is poured by injection or transfer molding.

16. The method of claim 1, further comprising the step of:
 e) cutting the support lead to disconnect the island portion and the lead frame.

17. The method of claim 2, further comprising the step of:
 e) cutting the support lead to disconnect the island portion and the lead frame.

18. The method of claim 3, further comprising the step of:
 e) cutting the support lead to disconnect the island portion and the lead frame.

19. The method of claim 4, further comprising the step of:
 e) cutting the support lead to disconnect the island portion and the lead frame.

20. The method of claim 3 or claim 6, where the synthetic resin is an epoxy resin selected from a group consisting of a bisphenol A, orthocresol novolak, or glycidyl amine epoxy resin.

21. The method of claim 2, further comprising the step of:
 e) cutting the support lead to disconnect the island portion and the lead frame.

22. The method of claim 4, further comprising the step of:
 d) cutting the support lead to disconnect the island portion and the lead frame.

* * * * *